United States Patent
Yeo et al.

(10) Patent No.: US 11,432,438 B2
(45) Date of Patent: Aug. 30, 2022

(54) CONVERTER INCLUDING PRINTED CIRCUIT BOARD AND POWER CONVERSION MODULE INCLUDING CONVERTER

(71) Applicant: Samsung Electronics Co., Ltd., Suwon-si (KR)

(72) Inventors: Gyoungsoo Yeo, Suwon-si (KR); Jeonggyu Park, Suwon-si (KR); Jaejin Lee, Suwon-si (KR); Seongu Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 16/844,671

(22) Filed: Apr. 9, 2020

(65) Prior Publication Data

US 2020/0329580 A1 Oct. 15, 2020

(30) Foreign Application Priority Data

Apr. 12, 2019 (KR) .......................... 10-2019-0043225

(51) Int. Cl.
*H02M 7/00* (2006.01)
*H05K 1/02* (2006.01)
(Continued)

(52) U.S. Cl.
CPC ............ *H05K 7/209* (2013.01); *H02M 7/003* (2013.01); *H05K 1/0203* (2013.01); *H05K 1/144* (2013.01);
(Continued)

(58) Field of Classification Search
CPC . F28F 3/12; H01H 9/52; H01L 23/473; H01L 25/112; H01L 2924/00;
(Continued)

(56) References Cited

U.S. PATENT DOCUMENTS 4,514,799 A * 4/1985 Spencer .............. G06F 15/7864
710/300
5,184,291 A * 2/1993 Crowe .................. H02M 7/003
363/141
(Continued)

OTHER PUBLICATIONS

International Search Report and Written Opinion of the International Searching Authority in connection with International Application No. PCT/KR2020/004909 dated Jul. 28, 2020, 7 pages.
(Continued)

*Primary Examiner* — Timothy J Thompson
*Assistant Examiner* — Guillermo J Egoavil

(57) ABSTRACT

The disclosure relates to a communication technique and system after 4G systems for combining a 5G communication system with IoT technology to support higher data rates. Based on 5G communication and IoT-related technologies, the disclosure can be applied to intelligent services (e.g., smart home, smart building, smart city, smart or connected car, healthcare, digital education, retail, security, and safety). A converter may include: a first printed circuit board having a first controller for power conversion disposed on an inner surface of the first printed circuit board, the inner surface of the first printed circuit board comprised in an inner surface of the converter; a second printed circuit board having a second controller for power conversion disposed on an inner surface of the second printed circuit board, the inner surface of the second printed circuit board facing the inner surface of the first printed circuit board and comprised in the inner surface of the converter; first connectors disposed on the inner surface of the first printed circuit board; and second connectors disposed on the inner surface of the second printed circuit board, the second connectors configured to be coupled with the first connectors.

18 Claims, 4 Drawing Sheets

(51) Int. Cl.
*H05K 1/14* (2006.01)
*H05K 1/18* (2006.01)
*H05K 7/20* (2006.01)

(52) U.S. Cl.
CPC ....... *H05K 1/181* (2013.01); *H05K 2201/066* (2013.01); *H05K 2201/1003* (2013.01); *H05K 2201/10166* (2013.01); *H05K 2201/10409* (2013.01)

(58) Field of Classification Search
CPC .......... H01L 2924/0002; H02M 3/003; H02M 7/003; H02M 7/00; H03K 5/08; H03K 17/063; H03K 17/163; H03K 17/165; H03K 17/168; H05K 1/0203; H05K 1/144; H05K 1/181; H05K 1/02; H05K 1/14; H05K 1/18; H05K 1/145; H05K 2201/042; H05K 2201/066; H05K 2201/1003; H05K 2201/10166; H05K 2201/10189; H05K 2201/10409; H05K 7/209; H05K 7/20; H05K 7/1432; H05K 7/20254; H05K 7/20927
USPC ............................ 361/719; 327/313; 165/169
See application file for complete search history.

(56) References Cited

U.S. PATENT DOCUMENTS

| | | | |
|---|---|---|---|
| 5,313,107 A * | 5/1994 | Itoh | H02M 3/07 |
| | | | 326/88 |
| 6,272,015 B1 | 8/2001 | Mangtani | |
| 7,502,240 B2 | 3/2009 | Leung et al. | |
| 8,488,316 B2 | 7/2013 | Zeng et al. | |
| 9,543,933 B2 | 1/2017 | Ito | |
| 2001/0038527 A1 | 11/2001 | DiBene et al. | |
| 2006/0181857 A1 | 8/2006 | Belady et al. | |
| 2008/0024012 A1* | 1/2008 | Qahouq | H03K 17/167 |
| | | | 307/126 |
| 2010/0259895 A1* | 10/2010 | Cupps | G06F 3/04886 |
| | | | 713/600 |
| 2014/0262177 A1* | 9/2014 | Tang | H01L 25/112 |
| | | | 165/169 |
| 2015/0085903 A1* | 3/2015 | Gundel | H05K 5/0026 |
| | | | 375/219 |
| 2015/0173238 A1* | 6/2015 | Nakanishi | H05K 7/1432 |
| | | | 29/830 |
| 2016/0291627 A1 | 10/2016 | Agrawal et al. | |
| 2018/0175853 A1* | 6/2018 | Curbow | H03K 17/168 |

OTHER PUBLICATIONS

Lamba, Ravita, et al., "Modeling and performance analysis of a concentrated photovoltaic-thermoelectric hybrid power generation system," Energy Conversion and Management, vol. 115, 2016, 11 pages.

European Patent Office, "Supplementary European Search Report" dated Apr. 7, 2022, in connection with European Patent Application No. 20787800.0, 11 pages.

* cited by examiner

CONVERTER INCLUDING PRINTED CIRCUIT BOARD AND POWER CONVERSION MODULE INCLUDING CONVERTER

CROSS-REFERENCE TO RELATED APPLICATION

This application is based on and claims priority under 35 U.S.C. § 119 to Korean Patent Application No. 10-2019-0043225 filed on Apr. 12, 2019 in the Korean Intellectual Property Office, the disclosure of which is incorporated by reference herein in its entirety.

BACKGROUND

1. Field

The disclosure relates to a converter including a printed circuit board and a power conversion module including the converter.

2. Description of Related Art

Since the commercial deployment of 4G communication systems, efforts have been made to develop improved 5G or pre-5G communication systems to meet the ever increasing demand for wireless data traffic. As such, 5G or pre-5G communication systems are also called "beyond 4G network" or "post LTE system". To achieve higher data rates, 5G communication systems consider utilization of the mmWave band (e.g., 60 GHz band). To decrease path loss and increase the transmission distance in the mmWave band, various technologies including beamforming, massive multiple-input multiple-output (massive MIMO), full dimensional MIMO (FD-MIMO), array antennas, analog beamforming, and large scale antennas are considered for 5G communication systems. To improve system networks in 5G communication systems, technology development is under way regarding evolved small cells, advanced small cells, cloud radio access networks (cloud RANs), ultra-dense networks, device-to-device (D2D) communication, wireless backhaul, moving networks, cooperative communication, coordinated multi-points (CoMP), reception interference cancellation, and the like. In addition, advanced coding and modulation (ACM) schemes such as hybrid FSK and QAM modulation (FQAM) and sliding window superposition coding (SWSC), and advanced access technologies such as filter bank multi carrier (FBMC), non-orthogonal multiple access (NOMA), and sparse code multiple access (SCMA) are also under development for 5G communication systems.

Meanwhile, the Internet is evolving from a human centered network where humans create and consume information into the Internet of Things (IoT) where distributed elements or things process and exchange information. There has also emerged the Internet of Everything (IoE) technology that combines IoT technology with big data processing technology through connection with cloud servers. To realize IoT services, base technologies related to sensing, wired/wireless communication and network infrastructure, service interfacing, and security are needed, and technologies interconnecting things such as sensor networks, machine-to-machine (M2M) or machine type communication (MTC) are under development. In IoT environments, it is possible to provide intelligent Internet technology services, which collect and analyze data created by interconnected things to add new values to human life. Through convergence and combination between existing information technologies and various field technologies, IoT technology may be applied to various areas such as smart homes, smart buildings, smart cities, smart or connected cars, smart grids, health-care, smart consumer electronics, and advanced medical services.

Accordingly, various attempts are being made to apply 5G communication systems to IoT networks. For example, sensor networks and machine-to-machine or machine type communication are being realized by use of 5G communication technologies including beamforming, MIMO, and array antennas. Application of cloud RANs to big data processing described above may be an instance of convergence of 5G communication technology and IoT technology.

SUMMARY

When a converter is operated for a long time, heat is generated by electronic elements disposed inside the converter, and the performance and durability of the converter may be reduced due to the generated heat. Accordingly, the disclosure provides structures for a converter and a power conversion device that can solve the above problem.

According to an embodiment of the disclosure, there is provided a converter. The converter may include: a first printed circuit board having a first controller for power conversion disposed on an inner surface of the first printed circuit board, the inner surface of the first printed circuit board comprised in an inner surface of the converter; a second printed circuit board having a second controller for power conversion disposed on an inner surface of the second printed circuit board, the inner surface of the second printed circuit board facing the inner surface of the first printed circuit board and comprised in the inner surface of the converter; first connectors disposed on the inner surface of the first printed circuit board; and second connectors disposed on the inner surface of the second printed circuit board, the second connectors configured to be coupled with the first connectors.

According to an embodiment of the disclosure, there is provided a power conversion module including a converter. The converter may include: a first printed circuit board having a first controller for power conversion disposed on an inner surface of the first printed circuit board, the inner surface of the first printed circuit board comprised in an inner surface of the converter; a second printed circuit board having a second controller for power conversion disposed on an inner surface of the second printed circuit board, the inner surface of the second printed circuit board facing the inner surface of the first printed circuit board and comprised in the inner surface of the converter; first connectors disposed on the inner surface of the first printed circuit board; and second connectors disposed on the inner surface of the second printed circuit board, the second connectors configured to be coupled with the first connectors.

According to an embodiment of the disclosure, it is possible to improve the durability and efficiency of a converter by enhancing the heat dissipation performance of the converter. In addition, because the converter can be configured as a separable structure, the degree of freedom in the design of the converter can be increased.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
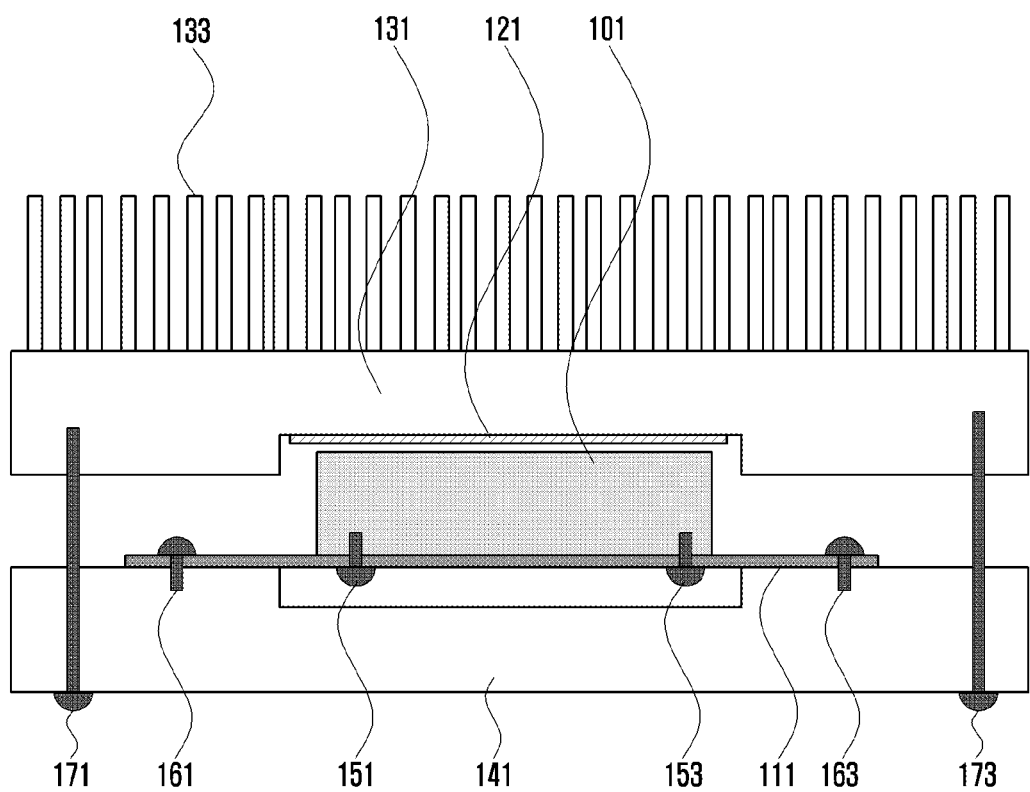
FIG. 1 illustrates a view of the structure of a power conversion module according to the related art.

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the disclosure are described in detail with reference to the accompanying drawings. Descriptions of functions and structures well known in the art and not directly related to the disclosure may be omitted for clarity and conciseness without obscuring the subject matter of the disclosure.

In the drawings, some elements are exaggerated, omitted, or only outlined in brief, and thus may be not drawn to scale. The same or similar reference symbols are used throughout the drawings to refer to the same or like parts.

The aspects, features, and advantages of certain embodiments of the disclosure will be more apparent from the following detailed description taken in conjunction with the accompanying drawings. The description of the various embodiments is to be construed as exemplary only and does not describe every possible instance of the disclosure. It should be apparent to those skilled in the art that the following description of various embodiments of the disclosure is provided for illustrative purposes only and not for the purpose of limiting the disclosure as defined by the appended claims and their equivalents. The same reference symbols are used throughout the description to refer to the same parts.

Meanwhile, it is known to those skilled in the art that blocks of a flowchart (or sequence diagram) and a combination of flowcharts may be represented and executed by computer program instructions. These computer program instructions may be loaded on a processor of a general purpose computer, special purpose computer, or programmable data processing equipment. When the loaded program instructions are executed by the processor, they create a means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out steps of functions described in the flowchart.

A block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit", "module", or the like may refer to a software component or hardware component such as an FPGA or ASIC capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose large components and units. Components and units may be configured to drive a device or one or more processors in a secure multimedia card. Also, in a certain embodiment, a module or unit may include one or more processors.

FIG. 1 illustrates a view of the structure of a power conversion module according to the related art.

With reference to FIG. 1, in one embodiment, a printed circuit board 111 may be disposed on one surface of the converter 101. In various embodiments, the printed circuit board may be a printed circuit board assembly (PBA).

In one embodiment, one surface of the printed circuit board 111 may be fixedly coupled to one surface of the converter 101 through at least one coupling member. In various embodiments, the at least one coupling member may include a first screw 151 and a second screw 153, and coupling holes for coupling with the first screw 151 and the second screw 153 may be formed in the printed circuit board 111 and the converter 101.

In one embodiment, the other surface of the printed circuit board 111 may be coupled with a first heat sink plate 141. In various embodiments, some of the heat generated by the operation of the converter 101 may be discharged through the first heat sink plate 141.

In one embodiment, the printed circuit board 111 and the first heat sink plate 141 may be fixedly coupled through at least one coupling member. In various embodiments, at least one coupling member may include a third screw 161 and a fourth screw 163, and coupling holes for coupling with the third screw 161 and the fourth screw 163 may be formed in the printed circuit board 111 and the first heat sink plate 141.

In one embodiment, a second heat sink plate 131 may be disposed on the other surface of the converter 101. In various embodiments, a thermal conduction pad 121 for conducting heat emitted from the converter 101 to the second heat sink plate 131 may be disposed on one surface of the second heat sink plate 131. In one embodiment, heat dissipation fins 133 may be disposed on one surface of the second heat sink plate 131 to improve the heat dissipation performance of the power conversion module.

In one embodiment, the first heat sink plate 141 and the second heat sink plate 131 may be fixedly coupled through at least one coupling member. In various embodiments, the at least one coupling member may include a fifth screw 171 and a sixth screw 173, and coupling holes for coupling with the fifth screw 171 and the sixth screw 173 may be formed in the first heat sink plate 141 and the second heat sink plate 131.

In one embodiment, when the first heat sink plate 141 and the second heat sink plate 131 are fixedly coupled by using the fifth screw 171 and the sixth screw 173, the second heat sink plate 131 and the converter 101 may be not in close contact. In various embodiments, as the second heat sink plate 131 and the converter 101 are not tightly coupled, the heat dissipation performance of the power conversion module may be reduced and the output of the converter may become unstable.

Figure 2:
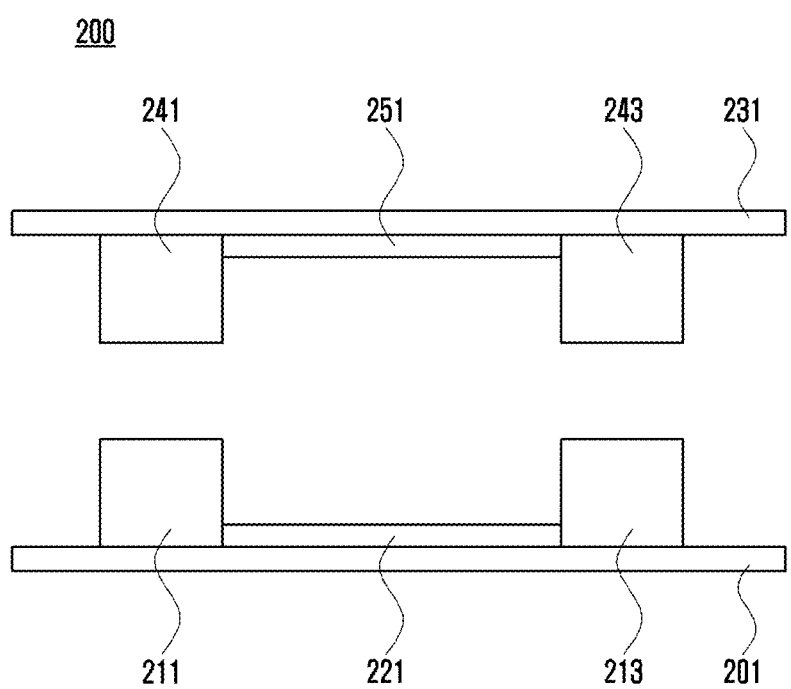
FIG. 2 illustrates a view of the structure of a converter according to an embodiment of the disclosure.

FIG. 2 illustrates a view of the structure of a converter according to an embodiment of the disclosure.

With reference to FIG. 2, in one embodiment, the converter 200 may be formed by using two printed circuit boards. For example, the converter 200 may be composed of a first module using the first printed circuit board 231 and a second module using the second printed circuit board 201.

In one embodiment, the converter 200 may include: a first printed circuit board 231 having a first controller 251 for power conversion installed on one surface that constitutes one surface of the converter 200 and constitutes an inner surface of the converter 200; a second printed circuit board 201 having a second controller 221 for power conversion installed on one surface that constitutes the other surface of the converter 200 facing the one surface of the first printed circuit board 231 and constitutes an inner surface of the converter 200; first connectors 241 and 243 disposed on the one surface of the first printed circuit board 231 constituting an inner surface of the converter 200; and second connectors 211 and 213 disposed on the one surface of the second printed circuit board 201 constituting an inner surface of the converter 200 to be coupled with the first connectors 241 and 243.

In one embodiment, the first printed circuit board 231, the first controller 251 and the first connectors 241 and 243 may constitute a first module of the converter 200, and the second printed circuit board 201, the second controller 220, and the second connectors 211 and 213 may constitute a second module of the converter 200. In various embodiments, the converter 200 may be formed by combining the first module and the second module through the first connectors 241 and 243 and the second connectors 211 and 213. In one embodiment, the converter configured using the first module and the second module may have a separable structure.

In one embodiment, the first controller 251 may include at least one of a transistor, an inductor, or a MOSFET for power conversion. In various embodiments, the first controller 251 may include elements generating a large amount of heat among the elements constituting the converter.

In one embodiment, the first controller 251 may include elements determining the performance of the converter. For example, the first controller 251 may include an inductor, and the output voltage of the converter may be determined based on the inductance of the inductor. In various embodiments, the performance of the converter (e.g., output voltage) can be changed by replacing only the first module including the first printed circuit board 231 with a new module including other elements and combining the new module with the existing second module. That is, according to an embodiment of the disclosure, it is possible to improve the design freedom of converter performance.

In one embodiment, the second controller 221 may include a control circuit for controlling the first controller 251. In various embodiments, the second controller 221 may transmit a control signal for controlling the switching operation of a transistor or MOSFET constituting the first controller 251.

In one embodiment, while the second controller 221 is fixed to the second module, a third controller having the same coupling position and scheme as the first controller 251 may be fixed to the first module instead of the first controller 251. In various embodiments, even if the third controller is coupled to the first module in place of the first controller 251, the third controller may be controlled by the second controller 221.

In one embodiment, the second module to which the second controller 221 including a control circuit unrelated to the voltage or power level is fixed may be coupled to the main printed circuit board of an electronic device including the converter 200. In various embodiments, the first module, which includes the first controller 251 generating a different amount of heat according to the voltage or power level, may be coupled to the second module through a connector or coupling member.

Hence, according to an embodiment of the disclosure, by detaching the first module from the second module and replacing only the first controller 251 included in the first module, it is possible to adjust the performance and heat generation of the converter without replacing the main printed circuit board. In other words, according to the disclosure, it is possible to design a converter having a different performance or generating a different amount of heat can be designed by replacing only the first controller 251 with a controller having the same coupling position and scheme as the first controller 251. In addition, according to the disclosure, it may be not necessary to change the design of the second module coupled to the main printed circuit board and the second controller 221 disposed on the second module to change the performance of the converter or the amount of heat generated thereby.

Meanwhile, the converter structure illustrated in FIG. 2 is only an embodiment of the disclosure, and the scope of the disclosure should not be limited thereto.

Figure 3:
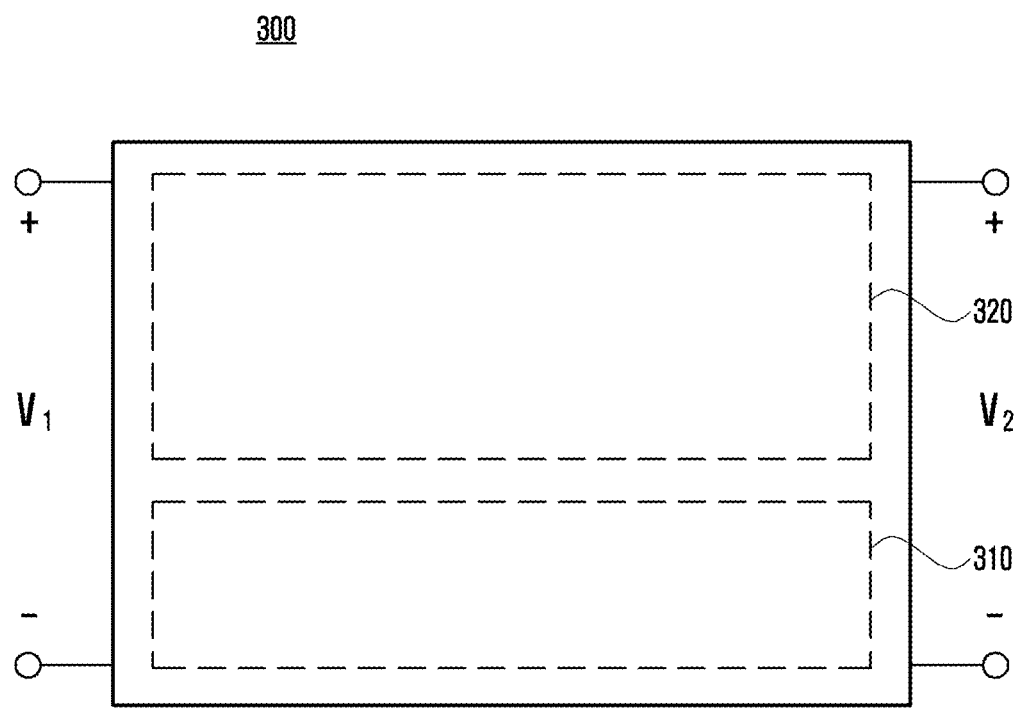
FIG. 3 illustrates a circuit schematic of the converter according to an embodiment of the disclosure.

FIG. 3 illustrates a circuit schematic of the converter according to an embodiment of the disclosure.

In one embodiment, the converter 300 may receive an input voltage of $V_1$ and output an output voltage of $V_2$. In various embodiments, the converter 300 may be composed of a first controller 320 including an inductor, a transistor, and a MOSFET, and a second controller 310 for controlling the first controller 320. That is, according to the disclosure, the converter 300 may be composed of the first controller 320 including physical elements constituting the converter, and the second controller 310 that is implemented through a circuit or a program and controls the first controller 320.

In one embodiment, the first controller 320 and the second controller 310 may be coupled respectively to separate printed circuit boards, and the first controller 320 and the second controller 310 may be combined through connectors arranged on the individual printed circuit boards. That is, according to the disclosure, the converter may be composed of a first module including the first controller 320 and a second module including the second controller 310, and the first module and the second module may be combined or separated through connectors.

Figure 4:
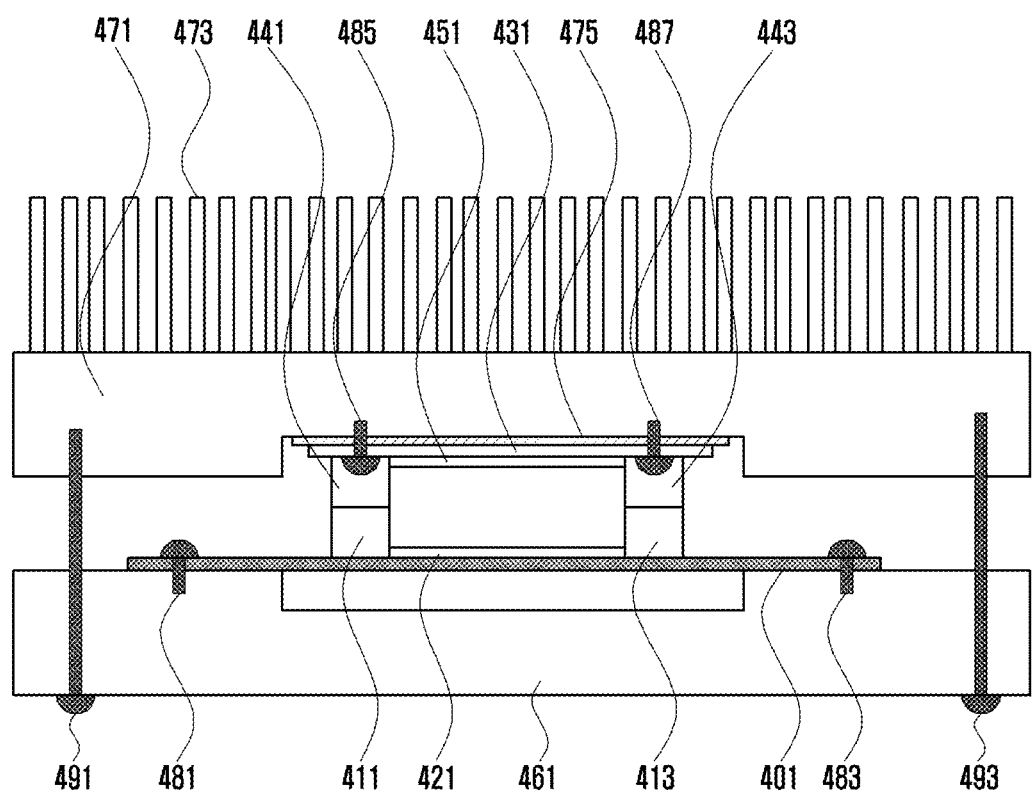
FIG. 4 illustrates a view of the structure of a power conversion module according to an embodiment of the disclosure.

FIG. 4 illustrates a view of the structure of a power conversion module according to an embodiment of the disclosure.

With reference to FIG. 4, in one embodiment, the power conversion module may include a converter. The converter may include: a first printed circuit board 431 having a first controller 451 for power conversion installed on one surface that constitutes one surface of the converter and constitutes an inner surface of the converter; a second printed circuit board 401 having a second controller 421 for power conversion installed on one surface that constitutes the other surface of the converter facing the one surface of the first printed circuit board 431 and constitutes an inner surface of the converter; first connectors 441 and 443 disposed on the one surface of the first printed circuit board 431 constituting an inner surface of the converter; and second connectors 411 and 413 disposed on the one surface of the second printed circuit board 401 constituting an inner surface of the converter to be coupled with the first connectors 441 and 443.

In one embodiment, the first printed circuit board 431, the first controller 451 and the first connectors 441 and 443 may constitute a first module of the converter, and the second printed circuit board 401, the second controller 420, and the second connectors 411 and 413 may constitute a second module of the converter. In various embodiments, the converter may be formed by combining the first module and the second module through the first connectors 441 and 443 and the second connectors 411 and 413. In one embodiment, the converter configured using the first module and the second module may have a separable structure.

In one embodiment, the first controller 451 may include at least one of a transistor, an inductor, or a MOSFET for power conversion. In various embodiments, the first controller 451 may include elements generating a large amount of heat among the elements constituting the converter.

In one embodiment, the first controller 451 may include elements determining the performance of the converter. For example, the first controller 451 may include an inductor, and the output voltage of the converter may be determined based on the inductance of the inductor. In various embodiments, the performance of the converter (e.g., output voltage) can be changed by replacing only the first module including the first printed circuit board 431 with a new module including other elements and combining the new module with the existing second module. That is, according to an embodiment of the disclosure, it is possible to improve the design freedom of converter performance.

In one embodiment, the second controller 421 may include a control circuit for controlling the first controller 451. In various embodiments, the second controller 421 may transmit a control signal for controlling the switching operation of a transistor or MOSFET constituting the first controller 451.

In one embodiment, a first heat sink plate 471 may be disposed on the other surface of the first printed circuit board 431, and a second heat sink plate 461 may be disposed on the other surface of the second printed circuit board 401.

In one embodiment, a thermal conduction pad 475 may be disposed between one surface of the first heat sink plate 471 and one surface of the first printed circuit board 431, and heat dissipation fins 473 may be disposed on the other surface of the first heat sink plate 471 to dissipate heat that is generated by the converter and conducted through the thermal conduction pad 475.

In one embodiment, the first printed circuit board 431 may be fixedly coupled to the first heat sink plate 471 through at least one coupling member. In various embodiments, the at least one coupling member may include a first screw 485 and a second screw 487, and coupling holes for coupling with the first screw 485 and the second screw 487 may be formed in the first printed circuit board 431 and the first heat sink plate 471.

In one embodiment, when the converter operates, heat may be generated by the elements arranged in the first controller 451. The heat generated by the first controller 451 may be transferred to the first heat sink plate 471 through the thermal conduction pad 475 and radiated to the outside of the power conversion module.

In one embodiment, the second printed circuit board 401 may be fixedly coupled to the second heat sink plate 461 through at least one coupling member. In various embodiments, the at least one coupling member may include a third screw 481 and a fourth screw 483, and coupling holes for coupling with the third screw 481 and the fourth screw 483 may be formed in the second printed circuit board 401 and the second heat sink plate 461.

In one embodiment, the first heat sink plate 471 and the second heat sink plate 461 may be fixedly coupled through at least one coupling member. In various embodiments, the at least one coupling member may include a fifth screw 491 and a sixth screw 493, and coupling holes for coupling with the fifth screw 491 and the sixth screw 493 may be formed in the first heat sink plate 471 and the second heat sink plate 461.

In one embodiment, the first printed circuit board 431 constituting the first module of the converter may be fixedly coupled to the first heat sink plate 471 and the thermal conduction pad 475 through the first screw 485 and the second screw 487, and the second printed circuit board 401 constituting the second module of the converter may be fixedly coupled to the second heat sink plate 461 through the third screw 481 and the fourth screw 483. Hence, according to the structure of the power conversion module proposed in the disclosure, heat generated from the first controller 451 combined with the first printed circuit board 431 and heat generated from the second controller 421 combined with the second printed circuit board 401 can be efficiently conducted through the corresponding heat sink plates coupled with the printed circuit boards.

Meanwhile, the power conversion module structure illustrated in FIG. 4 is only an embodiment of the disclosure, and the scope of the disclosure should not be limited thereto. For example, the first screw 485 and the second screw 487 for coupling the first printed circuit board 431 and the first heat sink plate 471, the third screw 481 and the fourth screw 483 for coupling the second printed circuit board 401 and the second heat sink plate 461, and the fifth screw 491 and the sixth screw 493 for coupling the first heat sink plate 471 and the second heat sink plate 461 may be replaced with tongs or clamps that can act the same as screws.

According to an embodiment of the disclosure, a converter may include: a first printed circuit board having a first controller for power conversion installed on one surface that constitutes one surface of the converter and constitutes an inner surface of the converter; a second printed circuit board having a second controller for power conversion installed on one surface that constitutes the other surface of the converter facing the one surface of the first printed circuit board and constitutes an inner surface of the converter; first connectors disposed on the one surface of the first printed circuit board constituting an inner surface of the converter; and second connectors disposed on the one surface of the second printed circuit board constituting an inner surface of the converter to be coupled with the first connectors.

In one embodiment, the first controller may include at least one of a transistor, an inductor, or a MOSFET for power conversion.

In one embodiment, the second controller may include a control circuit for controlling the transistor, the inductor, or the MOSFET included in the first controller.

In one embodiment, the first controller may include an element generating an amount of heat greater than or equal to a preset threshold among elements constituting the converter, and the second controller may include an element generating an amount of heat less than the preset threshold among the elements constituting the converter.

According to an embodiment of the disclosure, a power conversion module may include a converter wherein the converter may include: a first printed circuit board having a first controller for power conversion installed on one surface that constitutes one surface of the converter and constitutes an inner surface of the converter; a second printed circuit board having a second controller for power conversion installed on one surface that constitutes the other surface of the converter facing the one surface of the first printed circuit board and constitutes an inner surface of the converter; first connectors disposed on the one surface of the first printed circuit board constituting an inner surface of the converter; and second connectors disposed on the one surface of the second printed circuit board constituting an inner surface of the converter to be coupled with the first connectors.

In one embodiment, the power conversion module may further include a first heat sink plate disposed on the other surface of the first printed circuit board, and a second heat sink plate disposed on the other surface of the second printed circuit board.

In one embodiment, heat dissipation fins may be arranged on one surface of the first heat sink plate.

In one embodiment, the power conversion module may further include a thermal conduction pad disposed between the other surface of the first printed circuit board and the first heat sink plate.

In one embodiment, the first controller may include at least one of a transistor, an inductor, or a MOSFET for power conversion.

In one embodiment, the second controller may include a control circuit for controlling the transistor, the inductor, or the MOSFET included in the first controller.

In one embodiment, the first controller may include an element generating an amount of heat greater than or equal to a preset threshold among elements constituting the converter, and the second controller may include an element generating an amount of heat less than the preset threshold among the elements constituting the converter.

In one embodiment, the power conversion module may further include at least one coupling member to fixedly couple the first printed circuit board and the first heat sink plate, and coupling holes for coupling with the coupling member may be formed in one surface of the first printed circuit board and the first heat sink plate in which the at least one coupling member is disposed.

In one embodiment, the power conversion module may further include at least one coupling member to fixedly couple the second printed circuit board and the second heat sink plate, and coupling holes for coupling with the coupling member may be formed in one surface of the first printed circuit board and the first heat sink plate in which the at least one coupling member is disposed.

In one embodiment, the power conversion module may further include at least one coupling member to fixedly couple the first heat sink plate and the second heat sink plate, and coupling holes for coupling with the coupling member may be formed in one surface of the first heat sink plate and the second heat sink plate in which the at least one coupling member is disposed.

In one embodiment, the second printed circuit board may be a main printed circuit board of an electronic device, and the first controller may be replaced by a third controller including a transistor, an inductor, or a MOSFET and having a different heat generation amount and different electrical characteristic from the first controller.

In one embodiment, the at least one coupling member may include at least one of screws, tongs, or clamps.

Although the present disclosure has been described with various embodiments, various changes and modifications may be suggested to one skilled in the art. It is intended that the present disclosure encompass such changes and modifications as fall within the scope of the appended claims.

What is claimed is:

1. A converter including a printed circuit board, comprising:
    a first printed circuit board having a first controller for power conversion disposed on an inner surface of the first printed circuit board, the inner surface of the first printed circuit board comprised in an inner surface of the converter;
    a second printed circuit board having a second controller for power conversion disposed on an inner surface of the second printed circuit board, the inner surface of the second printed circuit board facing the inner surface of the first printed circuit board and comprised in the inner surface of the converter;
    first connectors disposed on the inner surface of the first printed circuit board; and
    second connectors disposed on the inner surface of the second printed circuit board, the second connectors configured to be coupled with the first connectors,
    wherein the second controller comprises a control circuit for controlling the first controller.

2. The converter of claim 1, wherein the first controller comprises at least one of a transistor, an inductor, or a MOSFET for power conversion.

3. The converter of claim 2, wherein the control circuit configured to control the transistor, the inductor, or the MOSFET included in the first controller.

4. The converter of claim 1, wherein the first controller comprises an element generating a first amount of heat corresponding to a voltage level and among elements constituting the converter, and
    wherein the second controller comprises an element generating a second amount of heat less than the first amount of heat and among the elements constituting the converter.

5. A power conversion module comprising a converter, wherein the converter comprises:
- a first printed circuit board having a first controller for power conversion disposed on an inner surface of the first printed circuit board, the inner surface of the first printed circuit board comprised in an inner surface of the converter;
- a second printed circuit board having a second controller for power conversion disposed on an inner surface of the second printed circuit board, the inner surface of the second printed circuit board facing the inner surface of the first printed circuit board and comprised in the inner surface of the converter;
- first connectors disposed on the inner surface of the first printed circuit board; and
- second connectors disposed on the inner surface of the second printed circuit board, the second connectors configured to be coupled with the first connectors,
- wherein the second controller comprises a control circuit for controlling the first controller.

6. The power conversion module of claim 5, further comprising:
- a first heat sink plate disposed on an outer surface of the first printed circuit board; and
- a second heat sink plate disposed on an outer surface of the second printed circuit board.

7. The power conversion module of claim 6, wherein heat dissipation fins are arranged on an outer surface of the first heat sink plate.

8. The power conversion module of claim 6, further comprising a thermal conduction pad disposed between the outer surface of the first printed circuit board and the first heat sink plate.

9. The power conversion module of claim 6, further comprising at least one coupling member to fixedly couple the first printed circuit board and the first heat sink plate, wherein coupling holes for coupling with the at least one coupling member are formed in one surface of the first printed circuit board and the first heat sink plate in which the at least one coupling member is disposed.

10. The power conversion module of claim 6, further comprising at least one coupling member to fixedly couple the second printed circuit board and the second heat sink plate, wherein coupling holes for coupling with the at least one coupling member are formed in one surface of the first printed circuit board and the first heat sink plate in which the at least one coupling member is disposed.

11. The power conversion module of claim 6, further comprising at least one coupling member to fixedly couple the first heat sink plate and the second heat sink plate, wherein coupling holes for coupling with the at least one coupling member are formed in one surface of the first heat sink plate and the second heat sink plate in which the at least one coupling member is disposed.

12. The power conversion module of claim 9, wherein the at least one coupling member includes at least one of screws, tongs, or clamps.

13. The power conversion module of claim 10, wherein the at least one coupling member includes at least one of screws, tongs, or clamps.

14. The power conversion module of claim 11, wherein the at least one coupling member includes at least one of screws, tongs, or clamps.

15. The power conversion module of claim 5, wherein the first controller comprises at least one of a transistor, an inductor, or a MOSFET for power conversion.

16. The power conversion module of claim 15, wherein the control circuit configured to control the transistor, the inductor, or the MOSFET included in the first controller.

17. The power conversion module of claim 5, wherein the first controller comprises an element generating a first amount of heat corresponding to a voltage level and among elements constituting the converter, and
- wherein the second controller comprises an element generating a second amount of heat less than the first amount of heat and among the elements constituting the converter.

18. The power conversion module of claim 5, wherein:
- the second printed circuit board is a main printed circuit board of an electronic device; and
- the first controller is replaceable with a third controller including a transistor, an inductor, or a MOSFET and having a different heat generation amount and different electrical characteristic from the first controller.

* * * * *